(12) United States Patent
Lee et al.

(10) Patent No.: US 10,330,974 B2
(45) Date of Patent: Jun. 25, 2019

(54) COLOR CONVERSION PANEL AND DISPLAY DEVICE INCLUDING THE SAME

(71) Applicant: Samsung Display Co., Ltd., Yongin-si, Gyeonggi-do (KR)

(72) Inventors: Kwang Keun Lee, Osan-si (KR); Jung Hyun Kwon, Seoul (KR); Young Min Kim, Asan-si (KR); Hae Ii Park, Seoul (KR); Moon Jung Baek, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/494,156

(22) Filed: Apr. 21, 2017

(65) Prior Publication Data
US 2017/0343853 A1 Nov. 30, 2017

(30) Foreign Application Priority Data

May 31, 2016 (KR) .......................... 10-2016-0067303

(51) Int. Cl.
*G02F 1/1335* (2006.01)
*H01L 27/12* (2006.01)

(52) U.S. Cl.
CPC .. *G02F 1/133528* (2013.01); *G02F 1/133514* (2013.01); *G02F 1/133553* (2013.01); *H01L 27/124* (2013.01); *G02F 2001/133565* (2013.01); *G02F 2202/36* (2013.01)

(58) Field of Classification Search
CPC .................................................... G02F 1/1335
See application file for complete search history.

(56) References Cited

U.S. PATENT DOCUMENTS

| 7,750,984 | B2 | 7/2010 | Ha et al. | |
|---|---|---|---|---|
| 8,277,064 | B2 | 10/2012 | Willemsen et al. | |
| 2008/0055515 | A1* | 3/2008 | Ha | G02B 6/0056 349/61 |
| 2008/0186576 | A1* | 8/2008 | Takada | G02B 5/3025 359/487.03 |
| 2010/0079704 | A1* | 4/2010 | Cho | G02F 1/133617 349/71 |

(Continued)

FOREIGN PATENT DOCUMENTS

| KR | 10-2010-0111103 A | 10/2010 |
|---|---|---|
| KR | 10-2014-0007648 A | 1/2014 |

(Continued)

OTHER PUBLICATIONS

Heo, G.J., et al., "Color PH-LCD Using STN Mode," Proc 5th Int Disp Workshops 1998, 1998, pp. 221-224.

(Continued)

*Primary Examiner* — Sang V Nguyen
(74) *Attorney, Agent, or Firm* — Innovation Counsel LLP

(57) ABSTRACT

An exemplary embodiment of the present disclosure provides a color conversion panel including: a substrate; a polarization layer that is disposed on the substrate and includes a plurality of polarization patterns spaced apart from each other at a predetermined interval; and a color conversion layer that is disposed on the polarization layer, wherein at least one of the plurality of polarization patterns may include an external light interference layer disposed on the substrate and a reflection layer disposed on the external light interference layer.

26 Claims, 12 Drawing Sheets

(56) References Cited

U.S. PATENT DOCUMENTS

| | | | | |
|---|---|---|---|---|
| 2012/0168889 A1* | 7/2012 | Ooka | ............... | H01L 27/14625 257/432 |
| 2012/0274882 A1* | 11/2012 | Jung | ............... | G02F 1/133617 349/96 |
| 2012/0319222 A1* | 12/2012 | Ozawa | ............. | H01L 27/14605 257/432 |
| 2013/0215507 A1* | 8/2013 | Sasaki | ............... | G02B 5/3058 359/485.05 |
| 2014/0160408 A1* | 6/2014 | Cho | ............... | G02F 1/133617 349/110 |
| 2015/0062500 A1* | 3/2015 | Park | ............... | G02B 5/3058 349/96 |
| 2015/0228232 A1* | 8/2015 | Lee | ............... | G09G 3/3607 345/88 |
| 2016/0033823 A1* | 2/2016 | Lee | ............... | G02F 1/133617 349/71 |
| 2016/0062178 A1* | 3/2016 | Kim | ............... | G02B 1/005 349/106 |
| 2016/0133209 A1* | 5/2016 | Lee | ............... | G09G 3/36 345/698 |
| 2016/0161654 A1* | 6/2016 | Yeo | ............... | G02B 5/3058 359/485.05 |
| 2016/0363812 A1* | 12/2016 | Li | ............... | G02F 1/133514 |
| 2017/0261778 A1* | 9/2017 | Lan | ............... | G02F 1/1334 |
| 2017/0261806 A1* | 9/2017 | Niu | ............... | G02F 1/133516 |

FOREIGN PATENT DOCUMENTS

| | | |
|---|---|---|
| KR | 10-2014-0140181 A | 12/2014 |
| KR | 10-2015-0094847 A | 8/2015 |

OTHER PUBLICATIONS

Oh, Jeong Rok, et al., "Highly efficient full-color display based on blue LED backlight and electrochromic light-valve coupled with front-emitting phosphors," Opt. Express 19, 16022-16031, Aug. 5, 2011.

Njo, Swie Lan, et al., "Light-Efficient Liquid Crystal Displays Using Photoluminescent Color Filters," SID Symposium Digest of Technical Papers, pp. 343-345, May 2000, vol. 31, Issue 1, Blackwell Publishing Ltd.

\* cited by examiner

COLOR CONVERSION PANEL AND DISPLAY DEVICE INCLUDING THE SAME

CROSS-REFERENCE TO RELATED APPLICATION

This application claims priority to and the benefit of Korean Patent Application No. 10-2016-0067303 filed in the Korean Intellectual Property Office on May 31, 2016, the entire contents of which are incorporated herein by reference.

BACKGROUND (a) Field

The present disclosure relates to a color conversion panel and a display device including the same.

(b) Description of the Related Art

A liquid crystal panel used as a display device includes two field generating electrodes, a liquid crystal layer, a color filter, and a polarizer. However, light loss occurs at the polarizer and the color filter of the display device. Accordingly, a display device that may reduce light loss and include a color conversion panel for realizing high efficiency has been suggested.

The above information disclosed in this Background section is only for enhancement of understanding of the background of the inventive concept and therefore it may contain information that does not form the prior art that is already known in this country to a person of ordinary skill in the art.

SUMMARY

The present disclosure has been made in an effort to provide a color conversion panel and a display device including the same that may reduce the reflection of external light, and may improve a light emission ratio and color reproducibility.

An exemplary embodiment of the present disclosure provides a color conversion panel including: a substrate; a polarization layer that is disposed on the substrate and includes a plurality of polarization patterns spaced apart from each other at a predetermined interval; and a color conversion layer and a transmissive layer that are disposed on the polarization layer, wherein at least one of the plurality of polarization patterns may include an external light interference layer disposed on the substrate and a reflection layer disposed on the external light interference layer. The color conversion layer may include a quantum dot.

A sum ($p=w+d$) of a width (w) of one of the plurality of polarization patterns and a distance (d) between adjacent polarization patterns may be equal to or less than about 200 nm.

The external light interference layer includes a first metal layer disposed on the substrate and a first inorganic layer disposed on the first metal layer.

The color conversion panel may further include a second inorganic layer disposed between the first metal layer and the substrate.

The first inorganic layer and the second inorganic layer may include at least one of a metal oxide, a silicon oxide, and a silicon nitride.

The first metal layer may include at least one of Cr, Mo, and Ti.

The reflection layer may include a metal material.

The metal material may include at least one of Ag, Au, Cu, and Al.

The color conversion panel may further include an optical layer disposed between the plurality of polarization patterns.

A refractive index of the optical layer may be about 1.0 to 1.4.

The polarization layer may directly contact the color conversion layer.

The color conversion panel may further include a capping layer disposed on the color conversion layer.

Another embodiment of the present disclosure provides a display device including: a display panel; and a color conversion panel disposed on the display panel, wherein the color conversion panel may include: a substrate; a polarization layer that is disposed between the substrate and the display panel and includes a plurality of polarization patterns spaced apart from each other at a predetermined interval; and a color conversion layer and a transmissive layer that are disposed between the polarization layer and the display panel, wherein at least one of the plurality of polarization patterns may include an external light interference layer disposed between the substrate and the display panel and a reflection layer disposed between the external light interference layer and the display panel. The color conversion layer may include a quantum dot.

A sum ($p=w+d$) of a width (w) of one of the plurality of polarization patterns and a distance (d) between adjacent polarization patterns may be equal to or less than about 200 nm.

The external light interference layer may include a first metal layer disposed between the substrate and the display panel and a first inorganic layer disposed between the first metal layer and the display panel.

The display device may further include an optical layer disposed between the plurality of polarization patterns.

A refractive index of the optical layer may be about 1.0 to 1.4.

Yet another embodiment of the present disclosure provides a display device including: a lower panel; a color conversion panel overlapping the lower panel; and a liquid crystal layer disposed between the lower panel and the color conversion panel, wherein the color conversion panel may include: a substrate; a polarization layer that is disposed between the substrate and the liquid crystal layer and includes a plurality of polarization patterns spaced apart from each other at a predetermined interval; and a color conversion layer and a transmissive layer that are disposed between the polarization layer and the liquid crystal layer, wherein at least one of the plurality of polarization patterns may include an external light interference layer disposed between the substrate and the liquid crystal layer and a reflection layer disposed between the external light interference layer and the liquid crystal layer. The color conversion layer may include a quantum dot.

A sum ($p=w+d$) of a width (w) of one of the plurality of polarization patterns and a distance (d) between adjacent polarization patterns may be equal to or less than about 200 nm.

The display device may further include an optical layer disposed between the plurality of polarization patterns, wherein a refractive index of the optical layer may be about 1.0 to 1.4.

Yet another embodiment of the present disclosure provides a display device including: a first substrate on which a thin film transistor is disposed, a second substrate facing the first substrate, a polarization layer disposed on the second substrate, a color conversion layer and a transmissive layer disposed on the polarization layer, wherein the polarizing layer includes a plurality of polarization patterns spaced apart from each other at a predetermined interval, and wherein at least one of the plurality of polarization patterns includes a reflection layer disposed on the second substrate, a first inorganic layer disposed on the reflection layer, a metal layer disposed on the first inorganic layer and a second inorganic layer disposed on the metal layer.

The display device may further an optical layer disposed between the plurality of polarization patterns, wherein the color conversion layer includes a quantum dot.

The optical layer may include a plurality of optical layers separated by the plurality of polarization patterns and a connecting layer connecting the plurality of optical layers and disposed on the plurality of polarization patterns.

The transmissive layer may not overlap the plurality of polarization patterns in a plan view.

The display device may further include a color filter disposed between the color conversion layer and the plurality of polarization patterns.

The display device may further include a third substrate disposed between the first substrate and the second substrate, and a first polarization layer and a second polarization layer disposed on the first substrate and the third substrate, respectively.

According to the embodiment of the present disclosure, in a color conversion panel and a display device, the reflection of external light may be reduced, and light emission ratio and color reproducibility may be improved.

DETAILED DESCRIPTION OF THE EMBODIMENTS

Figure 1:
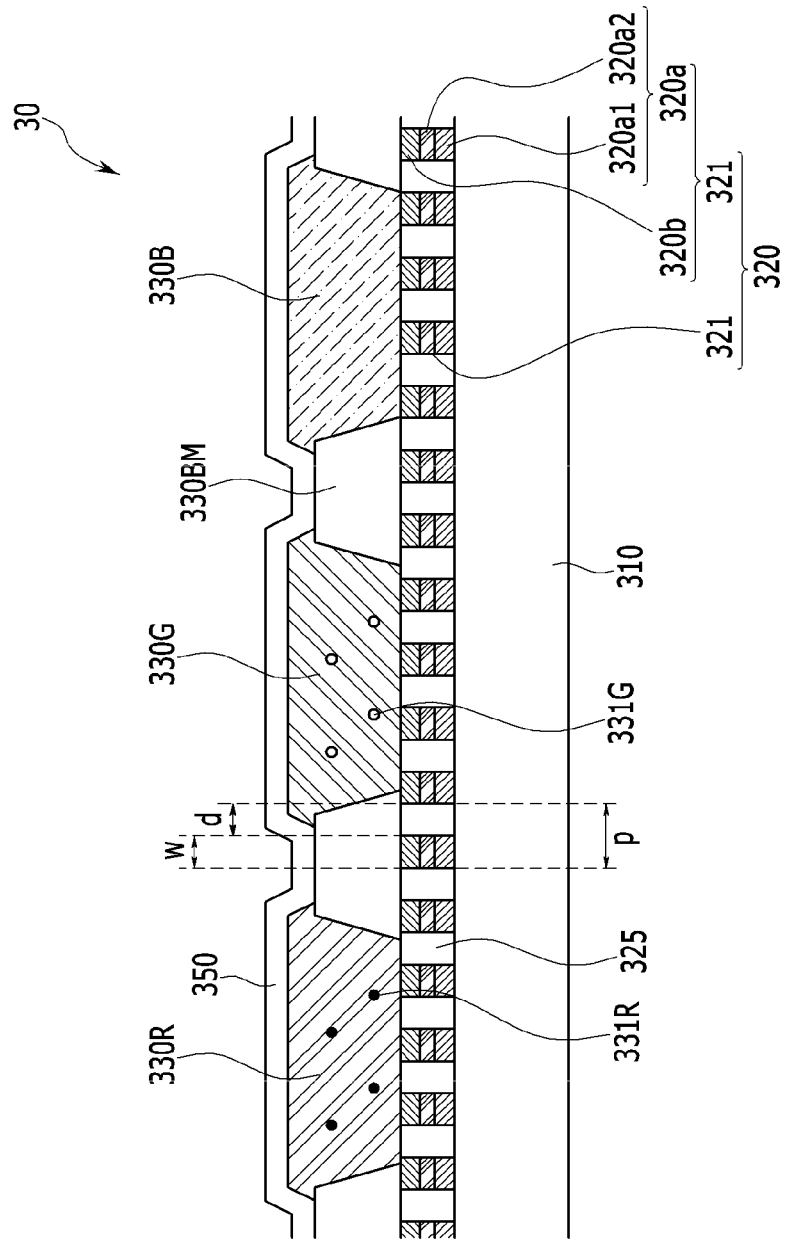
FIG. 1 illustrates a cross-sectional view of a color conversion panel according to an exemplary embodiment of the present disclosure.

The present inventive concept will be described more fully hereinafter with reference to the accompanying drawings, in which exemplary embodiments of the inventive concept are shown. As those skilled in the art would realize, the described embodiments may be modified in various different ways, all without departing from the spirit or scope of the present disclosure.

To clearly describe the present disclosure, portions which do not relate to the description are omitted, and like reference numerals designate like elements throughout the specification.

Further, the size and thickness of each component shown in the drawings are arbitrarily shown for better understanding and ease of description, but the present disclosure is not limited thereto. In the drawings, the thickness of layers, films, panels, regions, etc., are exaggerated for clarity. For better understanding and ease of description, the thickness of some layers and areas is exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means disposed on or below the object portion, and does not necessarily mean disposed on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

The phrase "on a plane" means viewing the object portion from the top, and the phrase "on a cross-section" means viewing a cross-section of which the object portion is vertically cut from the side.

Hereinafter, a color conversion panel according to an exemplary embodiment of the present disclosure will be described with reference to FIG. 1. FIG. 1 illustrates a cross-sectional view of a color conversion panel according to an exemplary embodiment of the present disclosure.

A color conversion panel 30 shown in FIG. 1 includes a polarization layer 320 disposed on a substrate 310. The polarization layer 320 may enhance a light emission ratio by polarizing light emitted from color conversion layers 330R and 330G and a transmissive layer 330B, absorbing external light, performing destructive interference with the external light, or reflecting light into the color conversion layers 330R and 330G and the transmissive layer 330B.

The polarization layer 320 includes a plurality of polarization patterns 321 spaced apart from each other at a predetermined interval. A pitch (p) between adjacent polarization patterns of the plurality of polarization patterns 321 is equal to or less than about 200 nm. The pitch (p) corresponds to a sum of a distance (d) (that is, an empty space) between the adjacent polarization patterns 321 and a width (w) of one polarization pattern 321. The width (w) of one polarization pattern 321 and the space distance (d) between the adjacent polarization patterns 321 respectively may be changed within a range equal to or less than about 200 nm without limitation.

At least one of the plurality of polarization patterns 321 includes an external light interference layer 320a and a reflection layer 320b disposed on the external light interference layer 320a.

Destructive interference of external light incident to the color conversion layers 330R and 330G and the transmissive layer 330B from the outside of the substrate 310 occurs at the external light interference layer 320a.

Without the external light interference layer 320a, most of the external light is reflected from the substrate 310 or a region adjacent to the substrate 310, and causes distortion of color reproducibility in the color conversion panel 30.

However, when the external light interference layer 320a is disposed on the substrate 310 according to the present exemplary embodiment, light reflected from respective interfaces of the external light interference layer 320a cause destructive interference, thus a reflection effect of the external light does not occur. Accordingly, the color conversion panel 30 may reduce color distortion due to the reflection of external light.

The external light interference layer 320a may include a first metal layer 320a1 and a first inorganic layer 320a2 disposed on the first metal layer 320a1. That is, the external light interference layer 320a may be configured with multiple layers including the first metal layer 320a1 and the first inorganic layer 320a2 which are sequentially stacked.

The first metal layer 320a1 has a high absorption coefficient and a high refractive index, and may be at least one selected from materials in which a real value and an imaginary value of a complex index of refraction are similar, and for example, may be at least one of Cr, Mo, and Ti. A thickness of the first metal layer 320a1 may be about 5 nm to about 20 nm.

The first inorganic layer 320a2 may include a metal oxide, a silicon oxide, and a silicon nitride, and for example, may include at least one of SiOx, SiNx, TiOx, ITO, IZO, CrOx, and MoOx. A thickness of the first inorganic layer 320a2 may be about 20 nm to about 120 nm.

As such, according to the external light interference layer 320a including the first metal layer 320a1 and the first inorganic layer 320a2, the external light incident from an outer surface of the substrate 310 may be reflected from interfaces between the first metal layer 320a1 and the first inorganic layer 320a, and the reflected light causes destructive interference therebetween. Accordingly, although there is no additional light blocking material, it is possible to block light and to absorb external light.

The reflection layer 320b is disposed on the external light interference layer 320a. Referring to FIG. 1, the reflection layer 320b is disposed between the external light interference layer 320a and the color conversion layers 330R and 330G, between the external light interference layer 320a and the transmissive layer 330B, and between the external light interference layer 320a and a light blocking layer 330BM.

The reflection layer 320b may include various metal materials for reflecting light, and for example, may include at least one of Ag, Au, Cu, and Al, which are high reflection materials. The reflection layer 320b containing a metal material is formed by a deposition process, an etching process, and the like, but the present disclosure is not limited thereto. A thickness of the reflection layer 320b may be equal to or greater than about 30 nm.

The reflection layer 320b reflects light incident to the substrate 310 through the color conversion layers 330R and 330G and the transmissive layer 330B. When the reflection layer 320b does not exist, the light incident to substrate 310 through the color conversion layers 330R and 330G or the transmissive layer 330B may be blocked by the external light interference layer 320a according to the exemplary embodiment of the present disclosure. Accordingly, the light emission ratio of the color conversion panel may be reduced.

However, according to the present exemplary embodiment, by disposing the reflection layer 320b between the external light interference layer 320a and the color conversion layers 330R and 330G and transmissive layer 330B, the light emitted toward the external light interference layer 320a is reflected back to the color conversion layers 330R and 330G or the transmissive layer 330B by the reflection layer 320b, and then is reflected back to a direction of the substrate 310 to outside of the substrate 310 by a capping layer 350 to be described later.

In other words, the reflection layer 320b reflects the light emitted to the external light interference layer 320a in a direction of the color conversion layers 330R and 330G and the transmissive layer 330B, and then the capping layer reflects the light reflected by the reflection layer 320b to a direction of the outer surface of the substrate 310, thereby enhancing the light emission ratio by recycling light.

An optical layer 325 is disposed between the plurality of polarization patterns 321 included in the polarization layer 320. The optical layer 325 may reduce light loss occurring at the surface of the substrate 310, and may reduce light emission loss that may be able to occur on a side surface of the polarization layer 320.

The optical layer 325 may have a lower refractive index than the substrate 310, and for example, the refractive index of the optical layer 325 may be about 1.0 to 1.4. The optical layer 325 may include a porous silica-based material, or may be empty space which is not filled with any material, but the present disclosure is not limited thereto, and any material satisfying the refractive index may be applied thereto.

The plurality of color conversion layers 330R and 330G, the transmissive layer 330B, and the light blocking layer 330BM are disposed on the polarization layer 320 and the optical layer 325.

The plurality of color conversion layers 330R and 330G may convert light that is incident thereto as different colors of light, and for example, the plurality of color conversion layers 330R and 330G may be a red color conversion layer 330R and a green color conversion layer 330G. The transmissive layer 330B may transmit light that is incident thereto without converting color, and for example, blue light may be incident to the transmissive layer 330B, and the transmissive layer 330B may output the blue light.

The red color conversion layer 330R includes at least one of a phosphor and a quantum dot 331R for converting blue light that is incident thereto into red light. When the red color conversion layer 330R includes a red phosphor, the red phosphor may contain one of (Ca, Sr, Ba)S, (Ca, Sr, Ba)$_2$Si$_5$N$_8$, CaAlSiN$_3$, CaMoO$_4$, and Eu$_2$Si$_5$N$_8$, but is not limited thereto. The red color conversion layer 330R may include at least one kind of red phosphor.

The green color conversion layer 330G includes at least one of a phosphor and a quantum dot 331G for converting blue light that is incident thereto into green light. When the green color conversion layer 330G includes the green phosphor, the green phosphor may contain one of yttrium aluminum garnet (YAG), (Ca, Sr, Ba)$_2$SiO$_4$, SrGa$_2$S$_4$, BAM, α-SiAlON, β-SiAlON, Ca$_3$Sc$_2$Si$_3$O$_{12}$, Tb$_3$Al$_5$O$_{12}$, BaSiO$_4$, CaAlSiON, and (Sr$_{1-x}$Ba$_x$)Si$_2$O$_2$N$_2$, but the present disclosure is not limited thereto. Herein, the x may be a random number between 0 and 1. The green color conversion layer 330G may include at least one kind of green phosphor.

The red color conversion layer 330R and the green color conversion layer 330G may include a quantum dot for converting color instead of the phosphor, or may further include a quantum dot in addition to the phosphor. In this case, the quantum dot may be selected from a group II-VI compound, a group III-V compound, a group IV-VI compound, a group IV element, a group IV compound, and a combination thereof.

The II-VI group compound may be selected from a two-element compound selected from CdSe, CdTe, ZnS, ZnSe, ZnTe, ZnO, HgS, HgSe, HgTe, MgSe, MgS, and a mixture thereof; a three-element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a four-element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The III-V group compound may be selected from a two-element compound selected from GaN, GaP, GaAs, GaSb, AlN, AlP, AlAs, AlSb, InN, InP, InAs, InSb, and a mixture thereof; a three-element compound selected from GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a four-element compound selected from GaAlNAs, GaAlNSb, GaAlPAs, GaAlPSb, GaInNP, GaInNAs, GaInNSb, GaInPAs, GaInPSb, GaAlNP, InAlNP, InAlNAs, InAlNSb, InAlPAs, InAlPSb, and a mixture thereof. The IV-VI group compound may be selected from a two-element compound selected from SnS, SnSe, SnTe, PbS, PbSe, PbTe, and a mixture thereof; a three-element compound selected from SnSeS, SnSeTe, SnSTe, PbSeS, PbSeTe, PbSTe, SnPbS, SnPbSe, SnPbTe, and a mixture thereof; and a four-element compound selected from SnPbSSe, SnPbSeTe, SnPbSTe, and a mixture thereof. The Group IV element may be selected from Si, Ge, and a mixture thereof. The Group IV compound may be a two-element compound selected from SiC, SiGe, and a mixture thereof.

In this case, the two-element compound, the three-element compound, or the four-element compound may exist at a uniform concentration in the color conversion layers, or exist to have partially different concentration in the color conversion layers. Alternatively, they may have a core/shell structure where one quantum dot encloses another quantum dot. An interface between the core and the shell may have a concentration gradient, such that a concentration of an element existing in the shell gradually decreases closer to a center of the core/shell structure.

The quantum dot may have a full width at half maximum (FWHM) of the light-emitting wavelength spectrum that is equal to or less than about 45 nm, preferably equal to or less than about 40 nm, and more preferably equal to or less than about 30 nm, and in this range, color purity or color reproducibility may be improved. In addition, since light emitted through the quantum dot is emitted in all directions, a viewing angle of light may be improved.

In addition, the quantum dot is not specifically limited to have shapes that are generally used in the technical field related to the present disclosure, and more specifically, may have a shape such as a nano-particle having a spherical shape, a pyramid shape, a multi-arm shape, or a cubic shape, or may be a nanotube, a nanowire, a nanofiber, a planar nano-particle, etc.

The transmissive layer 330B may include a resin that transmits blue light incident thereto. The transmissive layer 330B disposed in a region for emitting blue light transmits the incident blue light as it is. Although not illustrated herein, in some exemplary embodiments, the transmissive layer 330B may further include a dye or pigment.

The red color conversion layer 330R, the green color conversion layer 330G, and the transmissive layer 330B may include a photosensitive resin as an example, and may be manufactured by a photolithography process. Alternatively, the red color conversion layer 330R, the green color conversion layer 330G, and the transmissive layer 330B may be manufactured by a printing process, and when manufactured by the printing process, they may include materials other than the photosensitive resin.

In the present specification, it is illustrated that the color conversion layer, the transmissive layer, and the light blocking layer are formed by the photolithography process or the printing process, but the present disclosure is not limited thereto.

At least one of the red color conversion layer 330R, the green color conversion layer 330G, and the transmissive layer 330B may include a scatterer (not shown). For example, the red color conversion layer 330R, the green color conversion layer 330G, and the transmissive layer 330B may respectively include the scatterer, but are not limited thereto, and the transmissive layer 330B may include the scatterer, while the red color conversion layer 330R and the green color conversion layer 330G may not include the scatterer.

The scatterer may include any material that can evenly scatter incident light, and for example, may include one of $TiO_2$, $ZrO_2$, $Al_2O_3$, $In_2O_3$, ZnO, $SnO_2$, $Sb_2O_3$, and ITO.

The light blocking layer 330BM may be disposed between the color conversion layers and between a color conversion layer and the transmissive layer, for example, the light blocking layer 330BM may be disposed between the red color conversion layer 330R and the green color conversion layer 330G, between the green color conversion layer 330G and the transmissive layer 330B, and between the transmissive layer 330B and the red color conversion layer 330R, or between the layers 330R, 330G, and 330B. The light blocking layer 330BM may partition regions in which the red color conversion layer 330R, the green color conversion layer 330G, and the transmissive layer 330B are disposed.

The capping layer 350 is disposed on the red color conversion layer 330R, the green color conversion layer 330G, the transmissive layer 330B, and the light blocking layer 330BM.

The capping layer 350 may be a filter that prevents damage and quenching of the phosphor or the quantum dots 331R and 331G included in the red color conversion layer 330R and the green color conversion layer 330G during high temperature processes after the red color conversion layer 330R, the green color conversion layer 330G, and the transmissive layer 330B are formed, or the filter transmits light of a predetermined wavelength and reflects or absorbs light other than the predetermined wavelength.

The capping layer 350 may include a structure in which inorganic films having a high refractive index and inorganic films having a low refractive index are alternately stacked about 10 to 20 times. That is, the capping layer 350 may have a structure in which a plurality of layers having different refractive indexes are stacked alternately. In this case, the capping layer 350 may reflect or absorb light of a specific wavelength. It may transmit or/and reflect the light of the specific wavelength by using reinforcement interference and/or destructive interference between the inorganic film having the high refractive index and the inorganic film having the low refractive index.

The capping layer 350 may include at least one of $TiO_2$, $SiN_x$, $SiO_x$, TiN, AlN, $Al_2O_3$, $SnO_2$, $WO_3$, and $ZrO_2$, and for example, may be a structure in which $SiN_x$ and $SiO_x$ are alternately stacked.

In summary, the color conversion panel 30 according to the present exemplary embodiment includes the polarization layer 320 that is disposed between the substrate 310 and the color conversion layers 330R and 330G, between the substrate 310 and the transmissive layer 330B, or/and between the substrate 310 and the light blocking layer 330BM. Destructive interference of external light incident to the color conversion layers 330R and 330G and the transmissive layer 330B from the outside of the substrate 310 occurs at the external light interference layer 320a The polarization layer 320 includes a plurality of polarization patterns 321, and each polarization pattern 321 includes the external light interference layer 320a and the reflection layer 320b. The external light interference layer 320a may generate destructive interference between the reflected external light to reduce reflection due to external light, and the reflection layer 320b may increase a light emission ratio by reflecting light emitted toward the external light interference layer 320a from the color conversion layers 330R and 330G and the transmissive layer 330B back to the color conversion layers 330R and 330G and the transmissive layer 330B to reuse the light.

Figure 2:
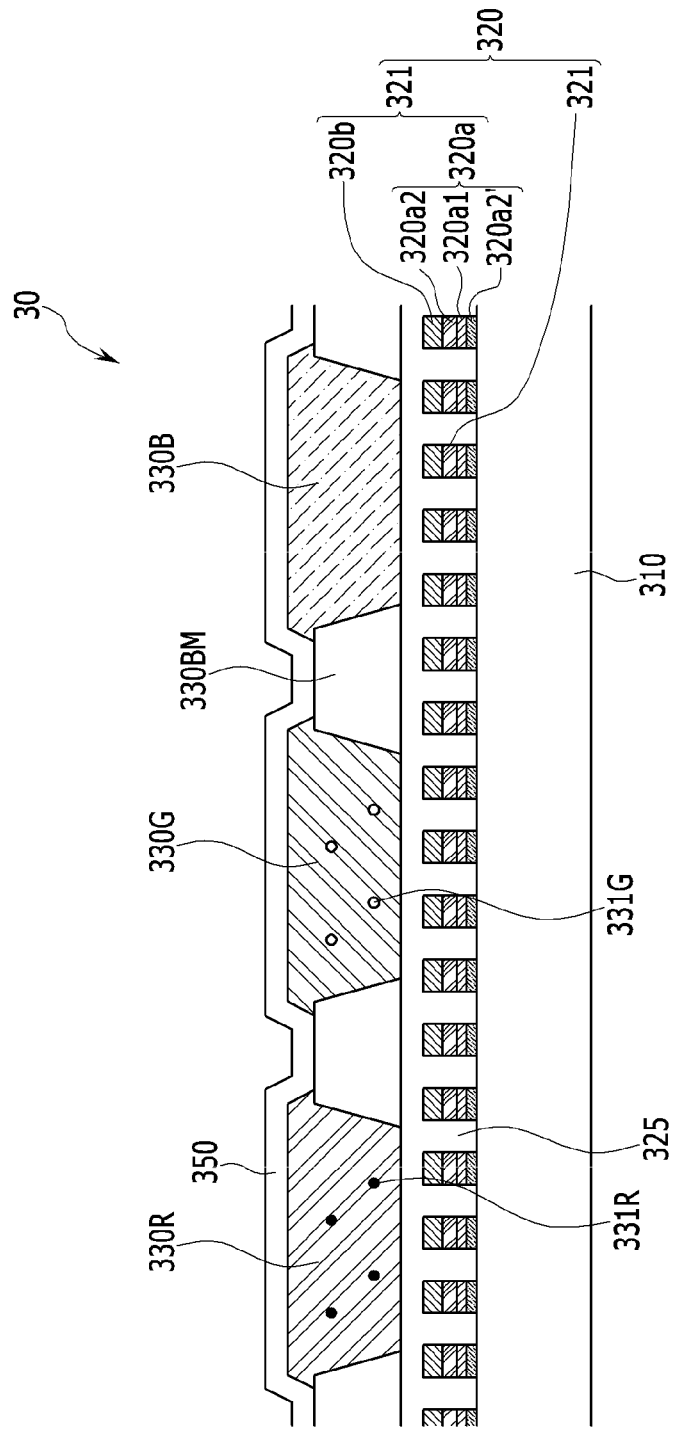
FIG. 2 illustrates a cross-sectional view of a color conversion panel according to an exemplary embodiment of the present disclosure.
Figure 3:
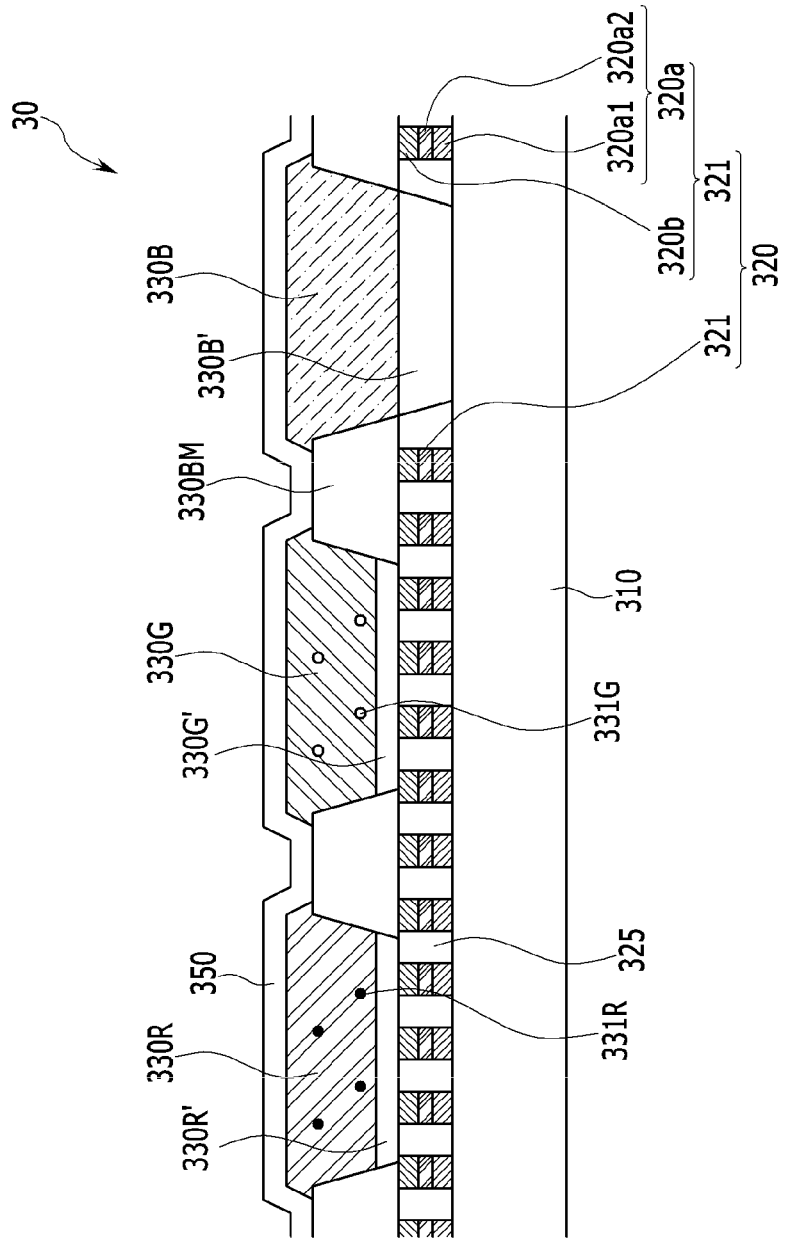
FIG. 3 illustrates a cross-sectional view of a color conversion panel according to an exemplary embodiment of the present disclosure.
Figure 4:
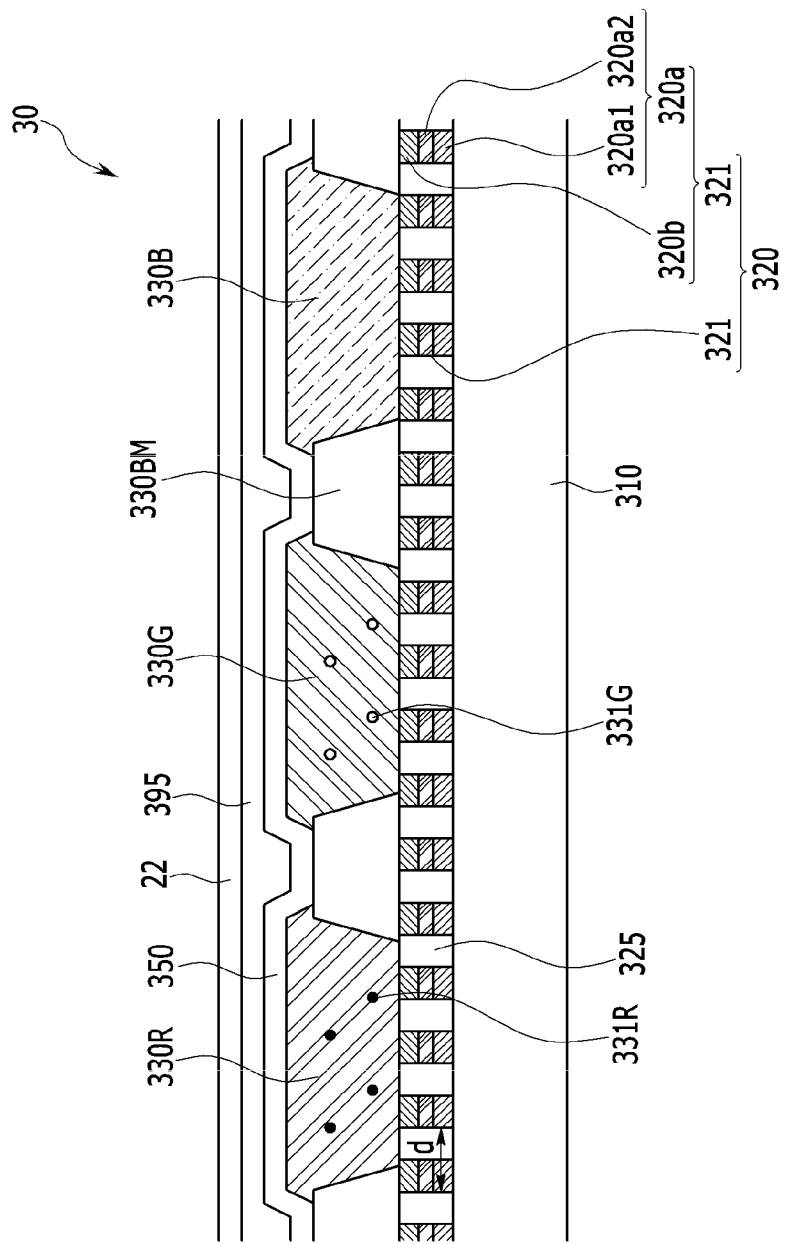
FIG. 4 illustrates a cross-sectional view of a color conversion panel according to an exemplary embodiment of the present disclosure.

A color conversion panel according to an exemplary variation will now be described with reference to FIG. 2 to FIG. 4. FIG. 2, FIG. 3, and FIG. 4 illustrate cross-sectional views of exemplary variations of FIG. 1. A repeated description for the same constituent elements as the constituent elements described with reference to FIG. 1 will be omitted.

Referring to FIG. 2, the color conversion panel 30 according to the present exemplary embodiment include the substrate 310, the polarization layer 320 that is disposed on the substrate 310 and includes the plurality of polarization patterns 321 spaced apart from each other at a predetermined interval, the optical layer 325 that is disposed between the plurality of polarization patterns 321 and covers a top surface of the plurality of polarization patterns 321, the red color conversion layer 330R that is disposed on the optical layer 325 and includes a red phosphor or/and a red quantum dot 331R, the green color conversion layer 330G including a green phosphor or/and a green quantum dot 331G, the transmissive layer 330B, the light blocking layer 330BM, and the capping layer 350 that is disposed on the red color conversion layer 330R, the green color conversion layer 330G, the transmissive layer 330B, and the light blocking layer 330BM.

At least one of the plurality of polarization patterns 321 of the polarization layer 320 includes the reflection layer 320b that is disposed on the external light interference layer 320a and the external light interference layer 320a.

The external light interference layer 320a may include a second inorganic layer 320a2' disposed on the substrate 310, the first metal layer 320a1 disposed on the second inorganic layer 320a2', and the first inorganic layer 320a2 disposed on the first metal layer 320a1. That is, the external light interference layer 320a may be a multi-layered structure in which the second inorganic layer, the first metal layer, and the first inorganic layer are sequentially stacked.

The first metal layer 320a1 has a high absorption coefficient and a high refractive index, and may be at least one selected from materials in which a real value and an imaginary value of a complex index of refraction are similar, and for example, may be at least one of Cr, Mo, and Ti. A thickness of the first metal layer 320a1 may be about 5 nm to about 20 nm.

The first inorganic layer 320a2 and the second inorganic layer (320a2') may include a metal oxide, a silicon oxide, and a silicon nitride, and for example, may include at least one of SiOx, SiNx, TiOx, ITO, IZO, CrOx, and MoOx. Each thickness of the first inorganic layer 320a2 and the second inorganic layer 320a2' may be about 20 nm to about 120 nm.

External light incident from an outer surface of the substrate 310 may be reflected from interfaces between respective layers included in the external light interference layer 320a, and the reflected light cause destructive interference therebetween. Accordingly, although there is no additional light blocking material, it is possible to block light.

The optical layer 325 is disposed between the plurality of polarization patterns 321 and on the plurality of polarization patterns 321. Accordingly, the optical layer 325 is disposed between the plurality of polarization patterns 321, and may be disposed to cover the plurality of polarization patterns 321.

The optical layer 325 may have a lower refractive index than the substrate 310. For example, the refractive index of the optical layer 325 may be about 1.0 to 1.4. The optical layer 325 having a low refractive index may reduce light loss occurring at the substrate 310 and the external interface, and may reduce light emission loss that may occur between the polarization layer 320 and the optical layer 325.

The optical layer 325 may include a porous silica-based material, but the present disclosure is not limited thereto, and any material satisfying the refractive index may be applied thereto.

Referring to FIG. 3, the color conversion panel 30 according to an exemplary embodiment of the present disclosure includes the substrate 310, and the polarization layer 320 that is disposed on the substrate 310 and includes the plurality of polarization patterns 321.

The polarization layer 320 includes the plurality of polarization patterns 321 that are spaced apart from each other at a predetermined interval, and at least one of the plurality of polarization patterns 321 includes the external light interference layer 320a and the reflection layer 320b disposed on the external light interference layer 320a.

The external light interference layer 320a may include the first metal layer 320a1 and the first inorganic layer 320a2 disposed on the first metal layer 320a1.

The polarization layer 320 may overlap the red color conversion layer 330R, the green color conversion layer 330G, and the light blocking layer 330BM, and in some exemplary embodiments, may not overlap the transmissive layer 330B. Since color distortion due to the reflection of the external light substantially occurs at the red color conversion layer 330R and the green color conversion layer 330G, the reflection of the external light may be substantially reduced when the polarization layer 320 does not overlap the transmissive layer 330B but overlap the red color conversion layer 330R and the green color conversion layer 330G.

The optical layer 325 may be disposed between the plurality of polarization patterns 321, it may overlap the red color conversion layer 330R, the green color conversion layer 330G, and the light blocking layer 330BM, and in some exemplary embodiments, may not overlap the transmissive layer 330B.

It is exemplarily described that the optical layer 325 does not overlap a top surface of the polarization layer 320 in FIG. 3, but the present disclosure is not limited thereto, and as shown in FIG. 2, it may be disposed to cover the top surface of the polarization layer 320.

The red color conversion layer 330R including the red phosphor or/and the red quantum dot 331R, the green color conversion layer 330G including the green phosphor or/and the green quantum dot 331G, and the light blocking layer 330BM are disposed on the polarization layer 320. Since the polarization layer 320 and the transmissive layer 330B do not overlap each other, the transmissive layer 330B may be directly disposed on the substrate 310.

The color conversion panel 30 may further include a color filter 330R' disposed between the optical layer 325 and the red color conversion layer 330R, a color filter 330G' disposed between the optical layer 325 and the green color conversion layer 330G, and a color filter 330B' disposed between the substrate 310 and the transmissive layer 330B.

The color filter 330R' disposed between the optical layer 325 and the red color conversion layer 330R may be a red color filter or a yellow color filter, the color filter 330G' disposed between the optical layer 325 and the green color conversion layer 330G may be a green color filter or a yellow color filter, and the color filter 330B' disposed between the substrate 310 and the transmissive layer 330B may be a blue color filter. The color filters 330W, 330G', and 330B' may provide improved color reproducibility, or may reduce the reflection of the external light by absorbing the external light.

The capping layer 350 is disposed on the red color conversion layer 330R, the green color conversion layer 330G, the transmissive layer 330B, and the light blocking layer 330BM.

Referring to FIG. 4, the color conversion panel 30 according to the exemplary embodiment of the present disclosure includes the substrate 310, and the polarization layer 320 that is disposed on the substrate 310 and includes the plurality of polarization patterns 321.

At least one of the plurality of polarization patterns 321 includes the external light interference layer 320a and the reflection layer 320b disposed on the external light interference layer 320a. The external light interference layer 320a may include the first metal layer 320a1 disposed on the substrate 310 and the first inorganic layer 320a2 disposed on the first metal layer 320a1.

Moreover, the color conversion panel 30 includes the optical layer 325 disposed between the plurality of polarization patterns 321, the red color conversion layer 330R that is disposed on the polarization layer 320 and the optical layer 325 and includes the red phosphor or/and the red quantum dot 331R, the green color conversion layer 330G including the green quantum dot 331G, the transmissive layer 330B, and the capping layer 350 that is disposed on the light blocking layer 330BM, the red color conversion layer 330R, the green color conversion layer 330G, the transmissive layer 330B, and the light blocking layer 330BM.

According the present exemplary embodiment, a planarization layer 395 and an auxiliary polarization layer 22 are disposed on the capping layer 350.

The planarization layer 395 serves to flatten the capping layer 350 having a step, may contain an organic material or an inorganic material, and in some exemplary embodiments, may be omitted.

The auxiliary polarization layer 22 polarizes light incident to an opposite surface which faces the substrate 310. The auxiliary polarization layer 22 may be used in an exemplary embodiment in which the color conversion panel 30 is bonded to another panel, and for example, may be used in an exemplary embodiment of FIG. 10 described later.

Figure 5:
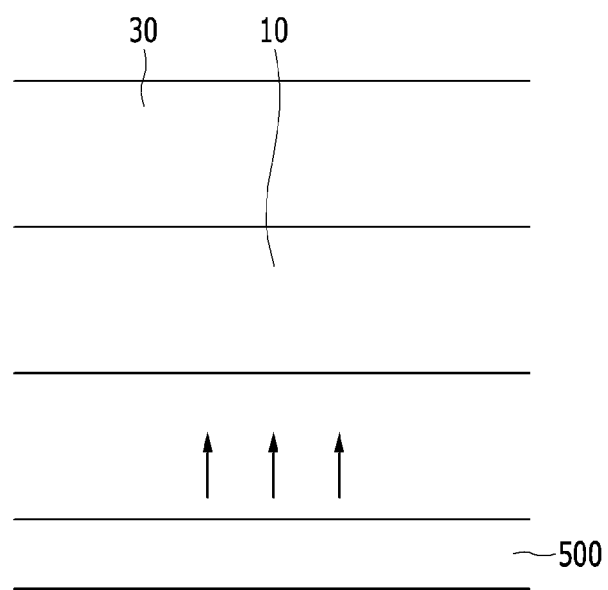
FIG. 5 illustrates a schematic cross-sectional view of a display device according to an exemplary embodiment of the present disclosure.
Figure 6:
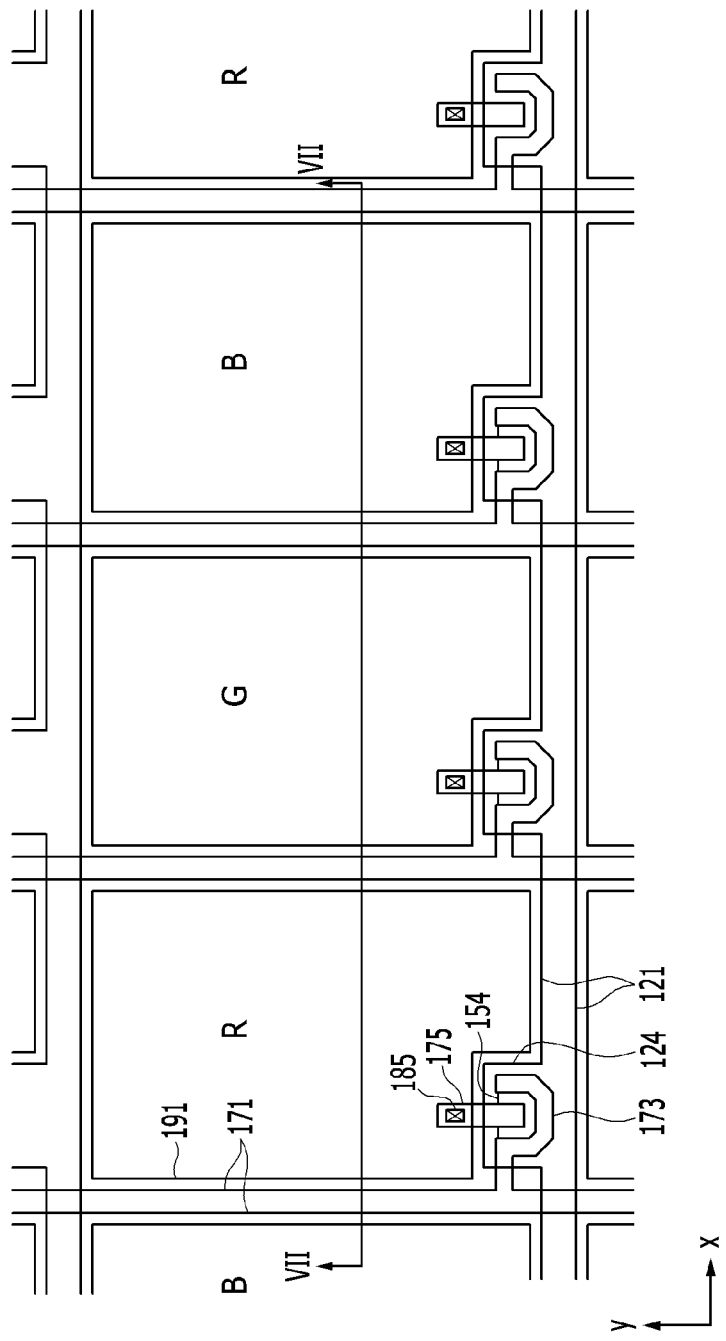
FIG. 6 illustrates a top plan view of a display device according to an exemplary embodiment of the present disclosure.
Figure 7:
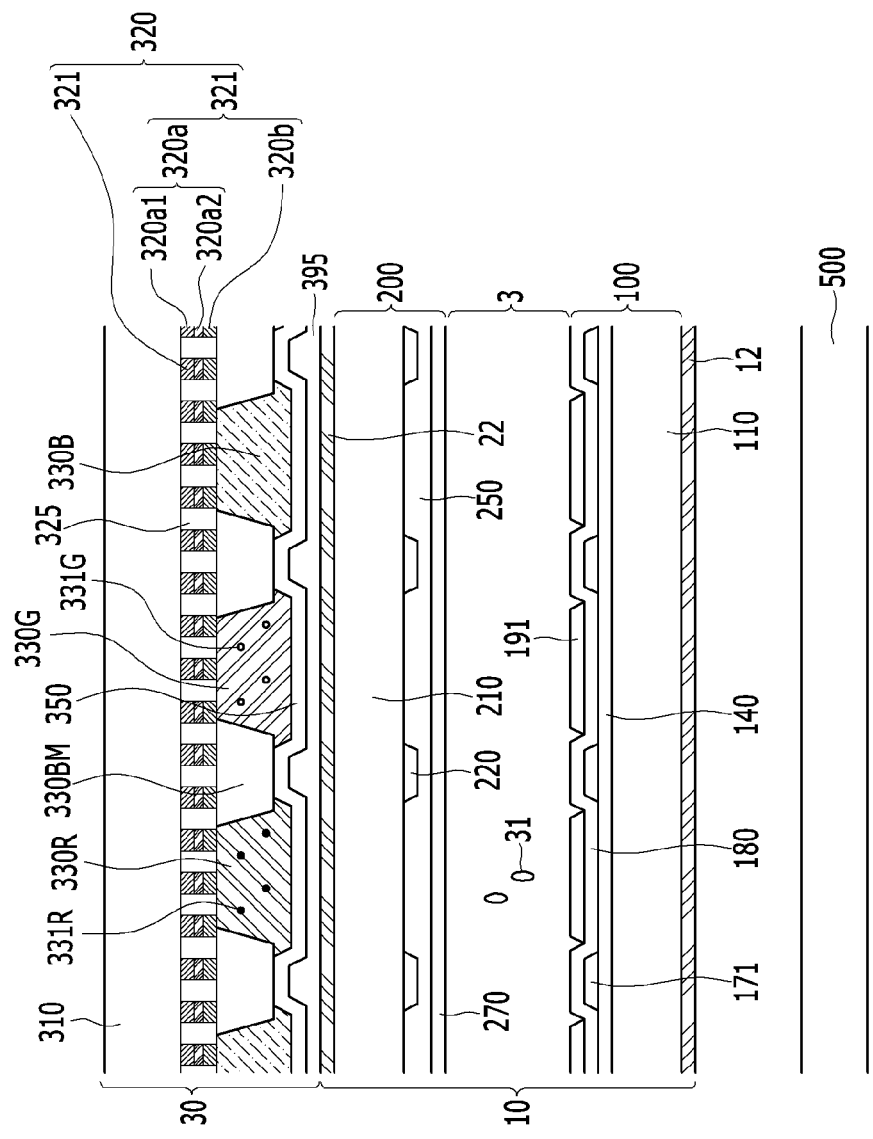
FIG. 7 illustrates a cross-sectional view taken along line VII-VII of FIG. 6.

Hereinafter, a display device according to an exemplary embodiment of the present disclosure will be described with reference to FIG. 5 to FIG. 7. FIG. 5 illustrates a schematic cross-sectional view of a display device according to an exemplary embodiment of the present disclosure, FIG. 6 illustrates a top plan view of the display device according to the exemplary embodiment of the present disclosure, and FIG. 7 illustrates a cross-sectional view taken along line VII-VII of FIG. 6.

Referring to FIG. 5 which schematically illustrate the display device according to the exemplary embodiment of the present disclosure, the display device includes a light unit 500, a display panel 10 disposed on the light unit 500, and the color conversion panel 30 disposed on the display panel 10. For example, the display panel 10 may be disposed between the color conversion panel 30 and the light unit 500.

The light unit 500 may include a light source that is disposed below the display panel 10 and emits light, and a light guide (not shown) that receives the light and guides the received light in a direction of the display panel 10 and the color conversion panel 30. When the display panel 10 is a self-emissive display device, the light unit 500 may be omitted.

The light unit 500 may include at least one light emitting diode (LED), and for example, may be a blue LED. The light source of the present exemplary embodiment may be an edge type of light unit disposed on at least one lateral surface of the light guide, or a direct type of light unit in which the light source of the light unit 500 is disposed directly under the light guide (not shown), but is not limited thereto.

The display panel 10 may include a liquid crystal panel generating a vertical electric field, but is not limited thereto, and may be a display panel such as a liquid crystal panel generating a horizontal electric field, a plasma display panel (PDP), an organic light emitting diode display (OLED), a surface conduction electron-emitter display (SED), a field emission display (FED), a vacuum fluorescent display (VFD), an e-paper, or the like. Hereinafter, the display panel 10 generating the vertical electric field will be exemplarily described in detail.

Although a separate polarizer is not illustrated in FIG. 4, in some exemplary embodiments, polarizers which are respectively disposed on upper and lower surfaces of the display panel 10 may be further included.

The color conversion panel 30 according to the present exemplary embodiment may be one of the color conversion panels described with reference to FIG. 1 to FIG. 4, thus a repeated description thereof will be omitted.

Referring to FIG. 7, the substrate 310 included in the color conversion panel 30 is disposed to overlap the display panel 10, the polarization layer 320 is disposed between the substrate 310 and the display panel 10, and the optical layer 325 is disposed between the plurality of polarization patterns 321 included in the polarization layer 320. The red color conversion layer 330R including the red phosphor or/and the red quantum dot 331R, the green color conversion layer 330G including the green phosphor or/and the green quantum dot 331G, the transmissive layer 330B, and the light blocking layer 330BM are disposed between the polarization layer 320 and the display panel 10. The capping layer 350 is disposed between the color conversion layers 330R and 330G and transmissive layer 330B and the display panel 10, and the planarization layer 395 in which a flat surface is provided is disposed between the capping layer 350 and the display panel 10.

In this case, at least one of the plurality of polarization patterns 321 included in the polarization layer 320 includes the external light interference layer 320a disposed between the substrate 310 and the display panel 10, and the reflection layer 320b disposed between the external light interference layer 320a and the display panel 10.

The external light interference layer 320a may include the first metal layer 320a1 disposed between the substrate 310 and the display panel 10, and the first inorganic layer 320a2 disposed between the first metal layer 320a1 and the display panel 10.

The reflection layer 320b is disposed between the external light interference layer 320a and the display panel 10. Referring to FIG. 7, the reflection layer 320b is disposed between the external light interference layer 320a and the color conversion layers 330R and 330G, between the external light interference layer 320a and the transmissive layer 330B, and between the external light interference layer 320a and the light blocking layer 330BM.

In summary, the polarization layer 320 includes the plurality of polarization patterns 321, each polarization pattern 321 includes the external light interference layer 320a and the reflection layer 320b, the external light interference layer 320a allows the external light reflected from respective layers of the external light interference layer 320a to cause destructive interference to reduce reflection of the external light, and the reflection layer 320b reflects light emitted toward the external light interference layer 320a through the color conversion layers 330R and 330G and the transmissive layer 330B back to the color conversion layers 330R and 330G and the transmissive layer 330B, thereby increasing the light emission ratio.

The display panel 10 includes a lower panel 100 including a thin film transistor, an upper panel 200 overlapping the lower panel 100, and a liquid crystal layer 3 interposed between the lower panel 100 and the upper panel 200. The display panel 10 according to the exemplary embodiment may further include a first polarizer 12 disposed between the lower panel 100 and the light unit 500, and a second polarizer 22 disposed between the upper panel 200 and the color conversion panel 30. The first polarizer 12 and the second polarizer 22 polarize light emitted from the light unit 500.

One or more of a coated type of polarizer and a wire grid polarizer may be used as the first and second polarizers 12 and 22. The polarizers 12 and 22 may be disposed at one surface of the display panels 100 and 200 in various forms such as a film form, a coated form, and an attached form. However, this description is one example, and the disclosure is not limited thereto.

The lower panel 100 includes a first substrate 110, and a plurality of pixels are disposed in a matrix form on the first substrate 110.

A gate line 121 that extends in an x direction and includes a gate electrode 124, a gate insulating layer 140 disposed on the gate line 121, a semiconductor layer 154 disposed on the gate insulating layer 140, a data line 171 and a drain electrode 175 that are disposed on the semiconductor layer 154, extend in a y direction, and include a source electrode 173, a passivation layer 180 disposed on the data line 171 and the drain electrode 175, and a pixel electrode 191 physically and electrically connected to the drain electrode 175 through a contact hole 185, are disposed on the first substrate 110.

The semiconductor layer 154 disposed on the gate electrode 124 forms a channel layer in a region exposed by the source electrode 173 and the drain electrode 175, and the gate electrode 124, the semiconductor layer 154, the source electrode 173, and the drain electrode 175 form one thin film transistor.

A second substrate 210 including the upper panel 200 overlaps the first substrate 110 while being separated from the first substrate 110. A light blocking layer 220, a planarization layer 250, and a common electrode 270 are disposed between the second substrate 210 and the liquid crystal layer 3.

The light blocking layer 220 may be disposed between the second substrate 210 and the liquid crystal layer 3, the planarization layer 250 which has a flat surface may be disposed between the light blocking layer 220 and the liquid crystal layer 3, and the common electrode 270 may disposed between the planarization layer 250 and the liquid crystal layer 3. In some exemplary embodiments, the planarization layer 250 may be omitted. The common electrode 270 receiving a common voltage generates an electric field along with the pixel electrode 191 to arrange a plurality of liquid crystal molecules 31 in the liquid crystal layer 3.

Although not illustrated, an alignment layer which is disposed between the pixel electrode 191 and the liquid crystal layer 3 or between the common electrode 270 and the liquid crystal layer 3 may be further included.

The liquid crystal layer 3 includes the plurality of liquid crystal molecules 31, and movement of the liquid crystal molecules 31 is controlled by the electric field formed between the pixel electrode 191 and the common electrode 270. An image may be displayed by controlling transmittance of light emitted from the light unit 500 according to a degree of the movement of the liquid crystal molecules.

In the present specification, the structure in which the light unit 500, the lower panel 100, the liquid crystal layer 3, the upper panel 200, and the color conversion panel 30 are sequentially stacked has been described and illustrated, but the present disclosure is not limited thereto, and may include a structure in which the light unit 500, the upper panel 200, the liquid crystal layer 3, the lower panel 100, and the color conversion panel 30 are sequentially stacked.

Figure 8:
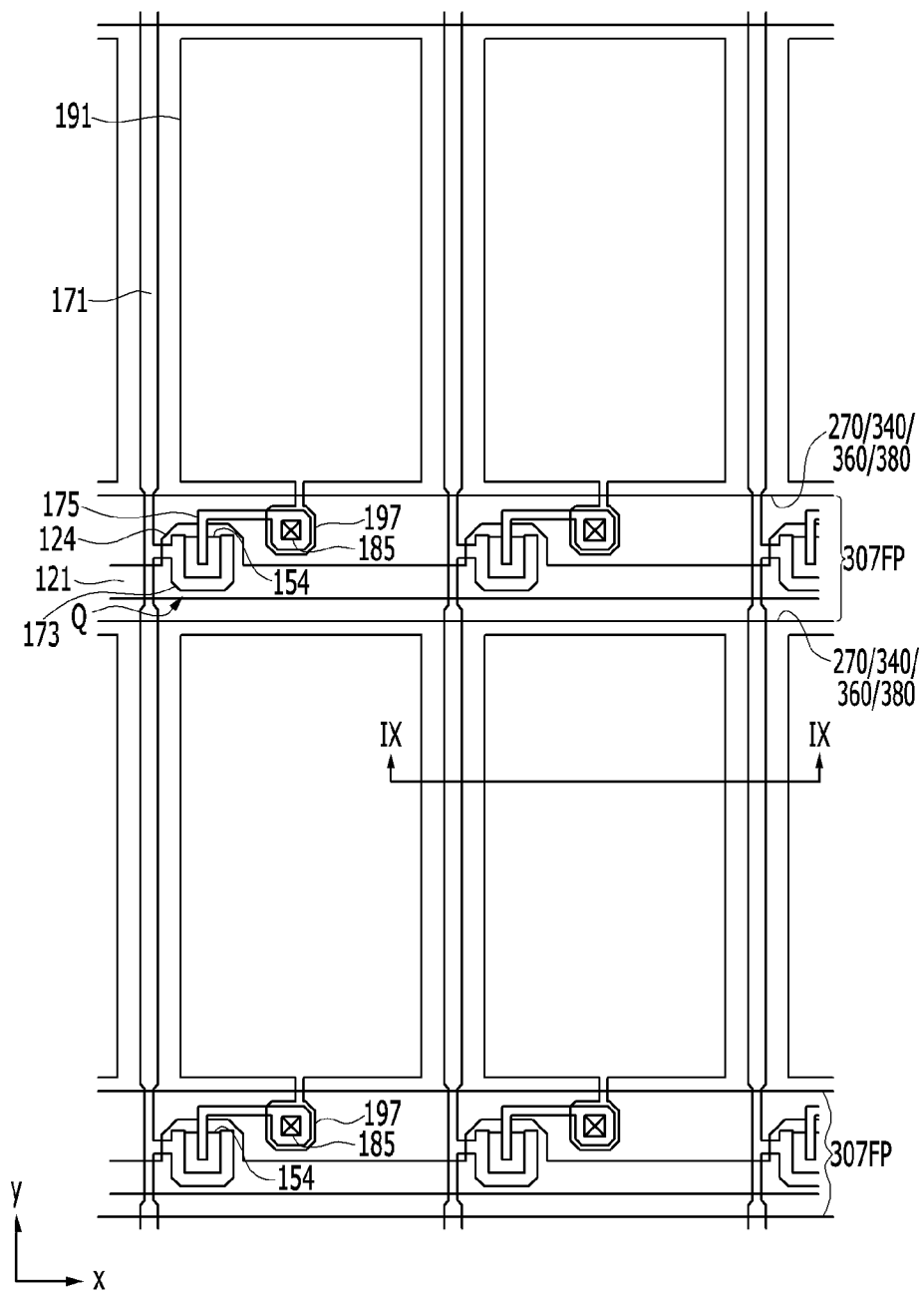
FIG. 8 illustrates a top plan view of a display device according to an exemplary embodiment of the present disclosure.
Figure 9:
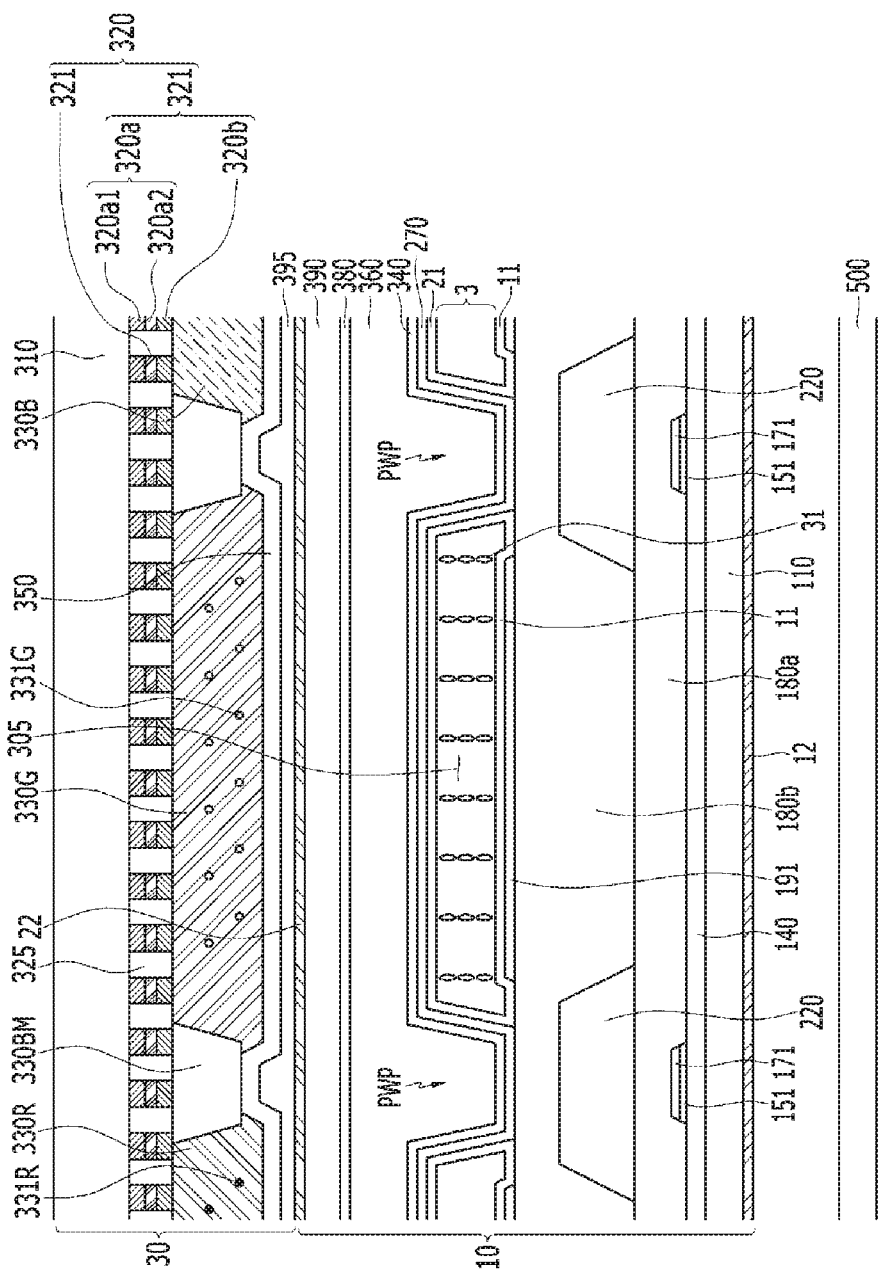
FIG. 9 illustrates a cross-sectional view taken along line IX-IX of FIG. 8.

Hereinafter, a display device according to an exemplary embodiment of the present disclosure will be described with reference to FIG. 8 and FIG. 9. FIG. 8 illustrates a top plan view of a display device according to the exemplary embodiment of the present disclosure, and FIG. 9 illustrates a cross-sectional view taken along line IX-IX of FIG. 8.

The display device according to the present exemplary embodiment includes the light unit 500, the display panel 10 disposed on the light unit 500, and the color conversion panel 30 disposed on the display panel 10. That is, the display panel 10 may be disposed between the color conversion panel 30 and the light unit 500. Since the light unit 500 is the same as that described with reference to FIGS. 5 to 7, a repeated description thereof will be omitted.

The color conversion panel 30 according to the present exemplary embodiment may be one of the color conversion panels described above with reference to FIG. 1 to FIG. 4, so a repeated description thereof will be omitted.

The substrate 310 included in the color conversion panel 30 is disposed to overlap the display panel 10, the polarization layer 320 is disposed between the substrate 310 and the display panel 10, the optical layer 325 is disposed between the plurality of polarization patterns 321 included in the polarization layer 320, and the red color conversion layer 330R including the red phosphor or/and the red quantum dot 331R, the green color conversion layer 330G including the green phosphor or/and the green quantum dot 331G, the transmissive layer 330B, and the light blocking layer 330BM are disposed between the polarization layer 320 and the display panel 10. In addition, the capping layer 350 is disposed between the color conversion layers 330R and the display panel 10 and between the transmissive layer 330B and the display panel 10, and the planarization layer 395 is disposed between the capping layer 350 and the display panel 10.

Here, at least one of the plurality of polarization patterns 321 included in the polarization layer 320 includes the external light interference layer 320a disposed between the substrate 310 and the display panel 10, and the reflection layer 320b disposed between the external light interference layer 320a and the display panel 10.

The external light interference layer 320a may include the first metal layer 320a1 disposed between the substrate 310 and the display panel 10, and the first inorganic layer 320a2 disposed between the first metal layer 320a1 and the display panel 10.

In summary, the polarization layer 320 includes the plurality of polarization patterns 321, each polarization pattern 321 includes the external light interference layer 320a and the reflection layer 320b, the external light interference layer 320a allows the external lights reflected from respective layers of the external light interference layer 320a to cause destructive interference to reduce reflection by the external light, and the reflection layer 320b reflects light emitted toward the external light interference layer 320a through the color conversion layers 330R and 330G and the transmissive layer 330B back to the color conversion layers 330R and 330G and the transmissive layer 330B, thereby increasing the light emission ratio.

FIG. 8 illustrates a 2×2 pixel which is a portion of a plurality of pixels that respectively correspond to a plurality of microcavities 305 (refer to FIG. 9), and such pixels may be iteratively arranged in up, down, left, and right directions in the display device according to the present exemplary embodiment.

The display panel 10 includes the first polarizer 12 disposed between the first substrate 110 and the light unit 500, and the second polarizer 22 disposed between a cover layer 390 and the color conversion panel 30, which will be described later. The first polarizer 12 and the second polarizer 22 polarize light incident from the light unit 500.

One or more of a coated type of polarizer and a wire grid polarizer may be used as the first and second polarizers 12 and 22. The polarizers 12 and 22 may be disposed at one surface of the display panels 100 and 200 in various forms such as a film form, a coated form, and an attached form. However, this description is one example, and the disclosure is not limited thereto.

Referring to FIG. 8 and FIG. 9, the gate line 121 is disposed on the first substrate 110, and includes the gate electrode 124.

The gate insulating layer 140 is disposed on the first substrate 110 and the gate line 121. A semiconductor layer 151 and a semiconductor layer 154 are disposed on the gate insulating layer 140, and the semiconductor layer 151 is disposed below the data line 171, while the semiconductor layer 154 is disposed below the source and drain electrodes 173 and 175 and a channel portion of a thin film transistor Q.

The data conductors 171, 173, and 175 including the data line 171 including the source electrode 173 as well as the drain electrode 175 are disposed on the semiconductor layers 151 and 154 and the gate insulating layer 140.

The gate electrode 124, the source electrode 173, and the drain electrode 175 form the thin film transistor Q together with the semiconductor layer 154, and the channel of the thin film transistor Q is provided at the semiconductor layer 154 between the source electrode 173 and the drain electrode 175.

A first passivation layer 180a may be disposed on the data conductors 171, 173, and 175 and an exposed portion of the semiconductor layer 154. The light blocking layer 220 and a second passivation layer 180b are disposed on the first passivation layer 180a.

The light blocking layer 220 is formed to have a lattice structure provided with an opening corresponding to an area for displaying an image, and is made of a material that does not transmit light.

The first passivation layer 180a and the second passivation layer 180b may include an inorganic insulator or an organic insulator such as a silicon nitride (SiNx) and a silicon oxide (SiOx).

The first and second passivation layers 180a and 180b and the light blocking layer 220 are provided with the contact hole 185 exposing the drain electrode 175.

The pixel electrode 191 is disposed on the second passivation layer 180b. The pixel electrode 191 may be made of a transparent conductive material such as ITO, IZO, or the like.

The pixel electrode 191 may have an overall quadrangular shape, and may include a protrusion 197 protruding toward the thin film transistor Q. The protrusion 197 may be physically and electrically connected to the drain electrode 175 through the contact hole 185.

The above-described thin film transistor Q and pixel electrode 191 are just examples, but the structure of the thin film transistor and the design of the pixel electrode are not limited thereto, and may be changed to be variously applied.

A lower alignment layer 11 is disposed on the pixel electrode 191, and an upper alignment layer 21 is disposed to overlap the lower alignment layer 11. The lower alignment layer 11 and the upper alignment layer 21 may be vertical alignment layers.

In the present exemplary embodiment, a plurality of liquid crystal molecules 31 and an alignment material for forming the alignment layers 11 and 21 may be injected into the microcavities 305 by using capillary force. In the present exemplary embodiment, the lower alignment layer 11 and the upper alignment layer 21 are distinguished from each other only by their positions, and as shown in FIG. 9, may be connected to each other. The lower alignment layer 11 and the upper alignment layer 21 may be simultaneously formed.

The microcavities 305 are disposed between the lower alignment layer 11 and the upper alignment layer 21, and the liquid crystal molecules 31 injected into the microcavities 305 form the liquid crystal layer 3.

A plurality of the microcavities 305 may be arranged in a matrix form.

Between the plurality of microcavities 305 adjacent in a y direction, a plurality of liquid crystal inlets 307FP which overlaps the gate lines 121 are disposed. Between the plurality of microcavities 305 adjacent in an x direction, partition wall portions PWP are disposed. Each of the microcavities 305 may correspond to one or more pixel areas, and the pixel areas may correspond to an area for displaying an image.

The common electrode 270 and a third passivation layer 340 are disposed on the upper alignment layer 21. The common electrode 270 receives a common voltage, generates an electric field along with the pixel electrode 191 receiving a data voltage, and determines a direction in which the liquid crystal molecules 31 disposed in the microcavities 305 between two electrodes are inclined.

In the present exemplary embodiment, it is described that the common electrode 270 is disposed on the microcavities 305, but in some exemplary embodiments, the common electrode 270 may be disposed below the microcavities 305 such that the liquid crystals may be driven according to a coplanar electrode (CE) mode.

A roof layer 360 is disposed on the third passivation layer 340. The roof layer 360 serves to support the pixel electrode 191 and the common electrode 270 so that the microcavities 305 corresponding to spaces between the pixel electrode 191 and the common electrode 270 may be formed.

A fourth passivation layer 380 is disposed on the roof layer 360. The fourth passivation layer 380 may contact an upper surface of the roof layer 360, and in some exemplary embodiments, may be omitted.

The cover layer 390 is disposed on the fourth passivation layer 380. In the present exemplary embodiment, the cover layer 390 may be disposed on the fourth passivation layer 380 and at the liquid crystal inlet 307FP. In this case, the cover layer 390 may cover the liquid crystal inlet 307FP of the microcavities 305 exposed by the liquid crystal inlet 307FP.

As described above, the display device according to the exemplary embodiments may improve a light emission ratio and color reproducibility, may provide excellent display quality, and may simplify a manufacturing process and a structure thereof by using a single substrate.

Figure 10:
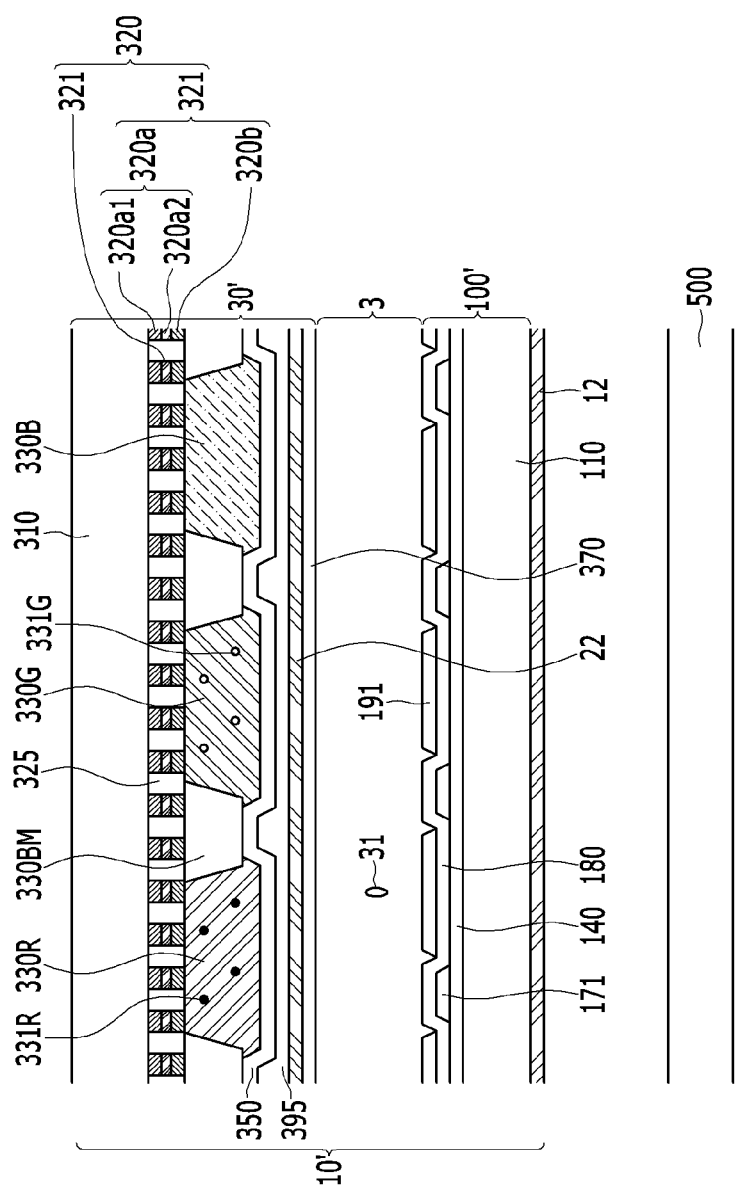
FIG. 10 illustrates a cross-sectional view of a display device according to an exemplary embodiment of the present disclosure.

Hereinafter, a display device according to an exemplary embodiment of the present disclosure will be described with reference to FIG. 10. FIG. 10 illustrates a cross-sectional view of a display device according to an exemplary embodiment of the present disclosure.

A display device according to an exemplary embodiment of the present disclosure shown in FIG. 10 includes a display panel 10' and the light unit 500. The display panel 10' may be disposed on the light unit 500, but the present disclosure is not limited thereto, and in some exemplary embodiments, their positions may be exchanged.

The display panel 10' according to the present exemplary embodiment includes a lower panel 100', a color conversion panel 30' that faces the lower panel 100' and spaced apart from the lower panel 100', and a liquid crystal layer 3 that is disposed between the lower panel 100' and the color conversion panel 30' and includes a plurality of liquid crystal molecules. Unlike the aforementioned exemplary embodiments, the color conversion panel 30' is a portion of the display panel 10' according to the present exemplary embodiment. That is, the color conversion panel 30' is disposed directly on the display panel 10' without an intervening second substrate 200 or and an intervening cover layer 390.

The lower panel 100' according to the present exemplary embodiment is the same as the lower panel 100 of FIG. 6 and FIG. 7, and the color conversion panel 30' may be replaced by the color conversion panel 30 of FIG. 1 to FIG. 4, thus FIG. 1 to FIG. 4 and FIG. 6 and FIG. 7 in addition to FIG. 10 may be referred to.

The lower panel 100' includes the gate line 121 that extends in one direction on the first substrate 110 and includes the gate electrode 124, the gate insulating layer 140 disposed on the gate line 121, the semiconductor layer 154 disposed on the gate insulating layer 140, the data line 171 and the drain electrode 175 that are disposed on the semiconductor layer 154, extend in a direction perpendicular to the one direction, and include the source electrode 173, the passivation layer 180 disposed on the data line 171 and the drain electrode 175, and the pixel electrode 191 physically and electrically connected to the drain electrode 175 through the contact hole 185.

The semiconductor layer 154 disposed on the gate electrode 124 forms a channel layer in a region exposed by the source electrode 173 and the drain electrode 175, and the gate electrode 124, the semiconductor layer 154, the source electrode 173, and the drain electrode 175 form one thin film transistor.

The color conversion panel 30' overlaps the first substrate 110 and the substrate 310 separated therefrom.

The substrate 310 included in the color conversion panel 30' is disposed to overlap the lower panel 100. The polarization layer 320 is disposed between the substrate 310 and the liquid crystal layer 3. The optical layer 325 is disposed between the plurality of polarization patterns 321 included in the polarization layer 320. The color conversion layers 330R and 330G are disposed between the polarization layer 320 and the liquid crystal layer 3. The red color conversion layers 330R includes the red phosphor or/and the red quantum dot 331R, the green color conversion layer 330G includes the green phosphor or/and the green quantum dot 331G. The transmissive layer 330B and the light blocking layer 330BM are disposed between the plurality of polarization layer 320 and the liquid crystal layer 3. In addition, the substrate 310 included in the color conversion panel 30' includes the capping layer 350 disposed between the color conversion layers 330R and 330G and the liquid crystal layer 3 and between the transmissive layer 330B and the liquid crystal layer 3, the planarization layer 395 disposed between the capping layer 350 and the liquid crystal layer 3, the second polarizer 22 disposed between the planarization layer 395 and the liquid crystal layer 3, and the common electrode 370 disposed between the second polarizer 22 and the liquid crystal layer 3. The common electrode 370 receiving a common voltage generates an electric field along with the pixel electrode 191 to control the liquid crystal molecules 31 of the liquid crystal layer 3.

Although not illustrated in the specification, an alignment layer which may be disposed between the pixel electrode 191 and the liquid crystal layer 3, or between the common electrode 370 and the liquid crystal layer 3, may be further included.

On the other hand, at least one of the plurality of polarization patterns 321 included in the polarization layer 320 includes the external light interference layer 320a disposed between the substrate 310 and the liquid crystal layer 3, and the reflection layer 320b disposed between the external light interference layer 320a and the liquid crystal layer 3.

The external light interference layer 320a may include the first metal layer 320a1 disposed between the substrate 310 and the display panel 10', and the first inorganic layer 320a2 disposed between the first metal layer 320a1 and the display panel 10'.

In summary, the polarization layer 320 includes the plurality of polarization patterns 321, each polarization pattern 321 includes the external light interference layer 320a and the reflection layer 320b, the external light interference layer 320a allows the external light reflected from respective layers of the external light interference layer 320a to cause destructive interference to reduce reflection of the external light, and the reflection layer 320b reflects light emitted toward the external light interference layer 320a through the color conversion layers 330R and 330G and the transmissive layer 330B back to the color conversion layers 330R and 330G and the transmissive layer 330B, thereby increasing the light emission ratio.

The first polarizer 12 disposed between the lower panel 100' and the light unit 500 may be further included in addition to the aforementioned second polarizer 22.

The display device according to the present exemplary embodiment described above does not include the upper panel 200 described with reference to FIG. 6 to FIG. 7, and the color conversion panel 30' replaces the upper panel in function and position. According to such a display device, it is possible to reduce the thickness, the weight, and the cost thereof.

In the present specification, the case that the display device includes the liquid crystal panel is described, but the display device is not limited thereto, and may include an organic light emitting panel. When the organic light emitting panel is used, the emission layer may emit blue light, and may respectively output red light, green light, and blue light through the color conversion panel, or the emission layer may emit white light and may respectively output red light, green light, and blue light through the color conversion panel.

Figure 11:
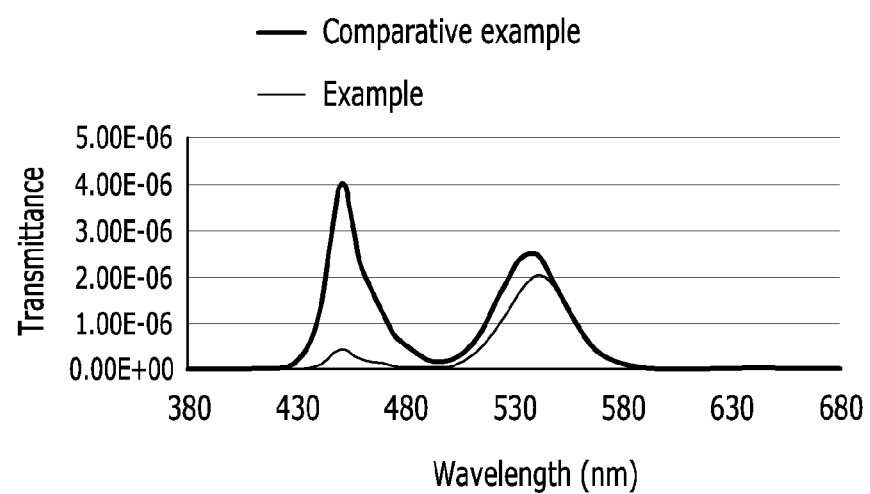
FIG. 11 and FIG. 12 respectively illustrate a transmittance graph and a reflectance graph with respect to an exemplary embodiment and a comparative example.
Figure 12:
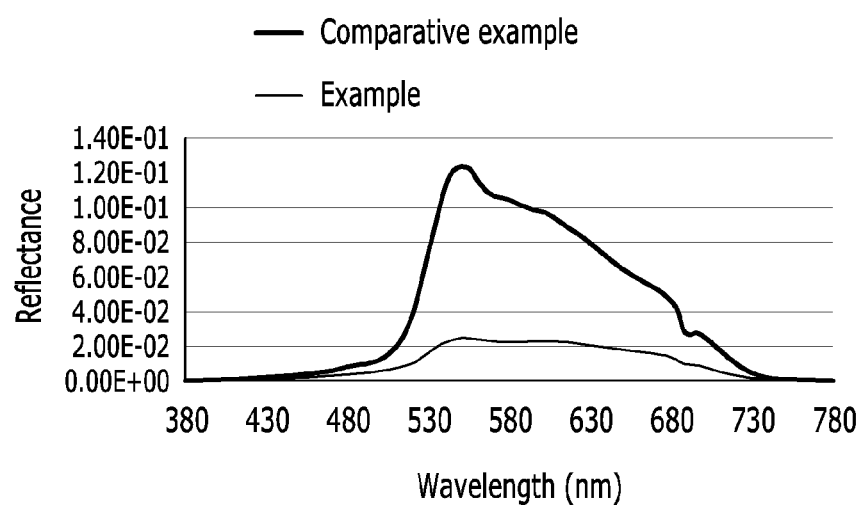

Hereinafter, transmittance and reflectance of an example according to an exemplary embodiment of the present disclosure and a comparative example will be described with reference to FIG. 11 and FIG. 12. FIG. 11 and FIG. 12 respectively illustrate a transmittance graph and a reflectance graph with respect to the example and the comparative example.

The example is a color conversion panel including a polarization layer disposed on a substrate, and the comparative example is a color conversion panel that does not include a polarization layer. Transmittance and reflectance of light passing through green color conversion layers of the example and the comparative example are compared.

Referring to FIG. 11, it can be seen that transmittances of the comparative example and the example are substantially similar in a wavelength range (about 500 to 600 nm) corresponding to green light. According to results of reflectance for respective wavelengths of the same example and comparative example, as shown in FIG. 12, it can be seen that the reflectance of the example is lowered by about 80% or more compared to the comparative example.

That is, it can be seen that the color conversion panel including the polarization layer according to the exemplary embodiments has substantially the same transmittance as the conventional color conversion panel while the reflectance thereof is considerably lowered. Accordingly, when the color conversion panel including the polarization layer according to the exemplary embodiments is provided, it is possible to reduce the reflection due to the external light, thus improving a contrast ratio (CR) and color reproducibility.

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A color conversion panel comprising:
   a substrate;
   a polarization layer that is disposed on the substrate and includes a plurality of polarization patterns spaced apart from each other at a predetermined interval; and
   a color conversion layer and a transmissive layer that are disposed on the polarization layer,
   wherein at least one of the plurality of polarization patterns includes a reflection layer disposed on the substrate and an external light interference layer disposed between the reflection layer and the substrate.

2. The color conversion panel of claim 1, wherein the color conversion layer includes a quantum dot, and
   wherein a sum (p=w+d) of a width (w) of one of the plurality of polarization patterns and a distance (d) between adjacent polarization patterns is equal to or less than about 200 nm.

3. The color conversion panel of claim 2, further comprising an optical layer disposed between the plurality of polarization patterns.

4. The color conversion panel of claim 3, wherein a refractive index of the optical layer is about 1.0 to about 1.4.

5. The color conversion panel of claim 1, wherein the external light interference layer includes a first metal layer disposed on the substrate and a first inorganic layer disposed on the first metal layer.

6. The color conversion panel of claim 5, further comprising a second inorganic layer disposed between the first metal layer and the substrate.

7. The color conversion panel of claim 6, wherein the first inorganic layer and the second inorganic layer include at least one of a metal oxide, a silicon oxide, and a silicon nitride.

8. The color conversion panel of claim 5, wherein the first metal layer includes at least one of Cr, Mo, and Ti.

9. The color conversion panel of claim 1, wherein the reflection layer includes a metal material.

10. The color conversion panel of claim 9, wherein the metal material includes at least one of Ag, Au, Cu, and Al.

11. The color conversion panel of claim 1, wherein the polarization layer directly contacts the color conversion layer and the transmissive layer.

12. The color conversion panel of claim 1, further comprising a capping layer disposed on the color conversion layer and the transmissive layer.

13. A display device comprising:
   a display panel; and
   a color conversion panel disposed on the display panel, wherein the color conversion panel includes:
   a substrate,
   a polarization layer that is disposed between the substrate and the display panel and includes a plurality of polarization patterns spaced apart from each other at a predetermined interval, and
   a color conversion layer and a transmissive layer that are disposed between the polarization layer and the display panel, and
   wherein at least one of the plurality of polarization patterns includes a reflection layer disposed on the substrate and an external light interference layer disposed between the reflection layer and the substrate.

14. The display device of claim 13, wherein the color conversion layer includes a quantum dot, and
   wherein a sum (p=w+d) of a width (w) of one of the plurality of polarization patterns and a distance (d) between adjacent polarization patterns is equal to or less than about 200 nm.

15. The display device of claim 13, wherein the external light interference layer includes a first metal layer disposed between the substrate and the display panel and a first inorganic layer disposed between the first metal layer and the display panel.

16. The display device of claim 13, further comprising an optical layer disposed between the plurality of polarization patterns.

17. The display device of claim 16, wherein a refractive index of the optical layer is about 1.0 to about 1.4.

18. A display device comprising:
a lower panel;
a color conversion panel overlapping the lower panel; and
a liquid crystal layer disposed between the lower panel and the color conversion panel,
wherein the color conversion panel includes:
a substrate,
a polarization layer that is disposed between the substrate and the liquid crystal layer and includes a plurality of polarization patterns spaced apart from each other at a predetermined interval, and
a color conversion layer and a transmissive layer that are disposed between the polarization layer and the liquid crystal layer, and
wherein at least one of the plurality of polarization patterns includes a reflection layer disposed on the substrate and an external light interference layer disposed between the reflection layer and the substrate.

19. The display device of claim 18, wherein the color conversion layer includes a quantum dot, and
wherein a sum (p=w+d) of a width (w) of one of the plurality of polarization patterns and a distance (d) between adjacent polarization patterns is equal to or less than about 200 nm.

20. The display device of claim 18, further comprising an optical layer disposed between the plurality of polarization patterns, wherein a refractive index of the optical layer is about 1.0 to about 1.4.

21. A display device comprising:
a first substrate on which a thin film transistor is disposed;
a second substrate facing the first substrate;
a polarization layer disposed on the second substrate; and
a color conversion layer and a transmissive layer disposed on the polarization layer,
wherein the polarizing layer includes a plurality of polarization patterns spaced apart from each other at a predetermined interval, and
wherein at least one of the plurality of polarization patterns includes a reflection layer disposed on the second substrate, a first inorganic layer disposed between the reflection layer and the second substrate, a metal layer disposed between the first inorganic layer and the second substrate and a second inorganic layer disposed on the metal layer, and
wherein the polarization layer is disposed between the second substrate and the color conversion layer.

22. The display device of claim 21, further comprising an optical layer disposed between the plurality of polarization patterns,
wherein the color conversion layer includes a quantum dot.

23. The display device of claim 22, wherein the optical layer includes a plurality of optical layers separated by the plurality of polarization patterns and a connecting layer connecting the plurality of optical layers and disposed on the plurality of polarization patterns.

24. The display device of claim 23, wherein the transmissive layer does not overlap the plurality of polarization patterns in a plan view.

25. The display device of claim 24, further comprising a color filter disposed between the color conversion layer and the plurality of polarization patterns.

26. The display device of claim 25, further comprising a third substrate disposed between the first substrate and the second substrate, and a first polarization layer and a second polarization layer disposed on the first substrate and the third substrate, respectively.

* * * * *